(12) United States Patent
Draper

(10) Patent No.: US 9,404,968 B1
(45) Date of Patent: Aug. 2, 2016

(54) SYSTEM AND METHODS FOR DEBUG CONNECTIVITY DISCOVERY

(71) Applicant: Altera Corporation, San Jose, CA (US)

(72) Inventor: Andrew Draper, High Wycombe (GB)

(73) Assignee: Altera Corporation, San Jose, CA (US)

( * ) Notice: Subject to any disclaimer, the term of this patent is extended or adjusted under 35 U.S.C. 154(b) by 294 days.

(21) Appl. No.: 14/063,957

(22) Filed: Oct. 25, 2013

(51) Int. Cl.
*G01R 31/3177* (2006.01)
*G01R 31/40* (2014.01)
*G01R 31/317* (2006.01)

(52) U.S. Cl.
CPC ...... *G01R 31/3177* (2013.01); *G01R 31/31701* (2013.01); *G01R 31/31705* (2013.01)

(58) Field of Classification Search
CPC ............. G01R 31/3177; G01R 31/31701; G01R 31/318516; G01R 31/318519; G01R 31/318536; G01R 31/318541; G01R 31/3193; G01R 31/31705
See application file for complete search history.

(56) References Cited

U.S. PATENT DOCUMENTS

| | | | | |
|---|---|---|---|---|
| 5,299,136 A * | 3/1994 | Babakanian | ....... | H03K 19/1738 714/727 |
| 5,590,354 A | 12/1996 | Klapproth et al. | | |
| 5,754,353 A * | 5/1998 | Behrens | .......... | G11B 5/09 361/51 |
| 5,862,338 A * | 1/1999 | Walker | .......... | H04L 49/351 709/224 |
| 6,530,047 B1 | 3/2003 | Edwards et al. | | |
| 6,658,478 B1 * | 12/2003 | Singhal | .......... | H04L 67/42 709/232 |
| 7,984,347 B2 | 7/2011 | Swoboda | | |
| 7,990,994 B1 * | 8/2011 | Yeh | .......... | H04L 12/4641 370/431 |
| 8,072,237 B1 * | 12/2011 | Rahim | .......... | H03K 19/17784 326/101 |
| 2005/0216629 A1 * | 9/2005 | Lindsay | .......... | G06F 13/4291 710/100 |
| 2006/0156067 A1 * | 7/2006 | Swoboda | .......... | G01R 31/31705 714/38.13 |
| 2007/0064852 A1 * | 3/2007 | Jones | .......... | G06F 1/04 375/356 |
| 2008/0005366 A1 * | 1/2008 | Raatni | .......... | G06F 13/24 710/8 |
| 2008/0114967 A1 * | 5/2008 | Saen | .......... | G06F 1/3228 712/221 |
| 2009/0094566 A1 * | 4/2009 | Bueti | .......... | G06K 19/067 716/103 |
| 2012/0323409 A1 * | 12/2012 | Wellbrook | .......... | G06F 13/4072 701/3 |
| 2013/0090887 A1 * | 4/2013 | Deogharia | .......... | G01R 31/318555 702/120 |
| 2013/0125204 A1 | 5/2013 | La Fever et al. | | |
| 2014/0098796 A1 * | 4/2014 | Xue | .......... | H04L 12/5692 370/336 |

FOREIGN PATENT DOCUMENTS

WO     2013147730    10/2013

* cited by examiner

*Primary Examiner* — Cynthia Britt
*Assistant Examiner* — Dipakkumar Gandhi
(74) *Attorney, Agent, or Firm* — Treyz Law Group, P.C.; Andrew C. Milhollin

(57) ABSTRACT

An integrated circuit device such as a programmable integrated circuit may include interface circuits and associated identification circuits. The identification circuits may be coupled to shared mixer circuitry that performs a logic function on mixer input signals received from the identification circuits of that integrated circuit to produce a mixer output signal. Debug computing equipment may be used to test integrated circuits having mixer circuitry. The debug computing equipment may have interfaces that receive connections to interface circuits of the integrated circuits. The debug computing equipment may communicate with the mixer circuitry of the integrated circuits through each of the connected interface circuits to identify groups of interfaces that are connected to different devices. For each device, the debug computing equipment may select an interface from the corresponding group of interfaces and perform test debug operations over the selected interface.

25 Claims, 10 Drawing Sheets

SYSTEM AND METHODS FOR DEBUG CONNECTIVITY DISCOVERY

BACKGROUND

Programmable integrated circuits are a type of integrated circuit that can be configured by a user to implement custom logic functions. In a typical scenario, a logic designer uses computer-aided design (CAD) tools to design a custom logic circuit. When the design process is complete, the CAD tools generate configuration data. The configuration data is loaded into a programmable integrated circuit to configure the device to perform desired logic functions.

Integrated circuits such as programmable integrated circuits can be connected to debug equipment for testing. The integrated circuits can be connected using different protocols and standards such as the Joint Test Action Group (JTAG) standard, the Universal Serial Bus (USB) standard, the Ethernet standard, and the Peripheral Component Interconnect Express (PCIe) standard. The debug equipment is used to test the functions of the integrated circuits and identify faults.

Debug equipment can be connected to multiple different devices to be tested. In addition, multiple connections can be made between the debug equipment and any given device. It can be challenging for the debug equipment to determine which devices are associated with each connection, especially because devices such as programmable integrated circuits can be configured in many different ways and are installed on many different types of boards.

SUMMARY

An integrated circuit device such as a programmable integrated circuit may include interface circuits that interface with external circuitry. The interface circuits may be USB interface circuits, PCIe interface circuits, Ethernet interface circuits, JTAG interface circuits, or interface circuits handling communications of any desired standard. The integrated circuit may include identification circuits each coupled to and identifying a respective interface circuit. The identification circuits may be coupled to shared mixer circuitry. Each identification circuit may store an identifier that identifies the type of the corresponding interface circuit. If desired, the identifier may be generated based partly on configuration data loaded into programmable elements of the integrated circuit so that the identifier identifies both the type of the corresponding interface circuit and the configuration of the device.

Each interface circuit may be coupled to one or more debug agent circuits through which internal circuitry is accessed during debug operations performed using that interface circuit. The debug agent circuits may include signal tap agent circuits, memory-mapped agent circuits, or agent circuits for performing any desired debug operations.

The mixer circuitry of each integrated circuit may include combinational logic circuitry that performs a logic function on mixer input signals received from the identification circuits of that integrated circuit to produce a mixer output signal. The combinational logic circuitry may include a logic XOR gate that receives the mixer input signals and produces the mixer output signal. The mixer circuitry may include clock crossing circuitry that interfaces between clock domains of the interface circuits and the clock domain of the mixer circuitry.

Debug computing equipment may be used to test integrated circuits. The debug computing equipment may have interfaces that receive connections to interface circuits of the integrated circuits. The debug computing equipment may include storage and processing circuitry that uses the interfaces to communicate with the mixer circuitry of the integrated circuits through each of the connected interface circuits. By communicating with the mixer circuitry of each of the connected integrated circuits, the debug computing equipment may identify groups of interfaces that are connected to different devices. For example, the debug computing equipment may provide reference values to the mixer circuitry and retrieve mixer output signals to identify which groups of interfaces are connected to different devices. For each device, the debug computing equipment may select an interface from the corresponding group of interfaces and perform test debug operations over the selected interface. The interface may be selected based on performance and/or functional capabilities of the group of interfaces.

Further features of the present invention, its nature and various advantages will be more apparent from the accompanying drawings and the following detailed description.

DETAILED DESCRIPTION

Embodiments of the present invention relate to debug systems in which one or more devices such as integrated circuits may be connected to debug computing equipment for testing. The integrated circuits may be digital signal processors, microprocessors, application specific integrated circuits, or other suitable integrated circuits. These types of debug systems can benefit from improved connectivity discovery such as automatic identification of connections to test devices. The test devices may include debug circuitry that communicates with the debug computing equipment during initial connection operations.

As an example, one or more integrated circuits such as a programmable integrated circuit may be connected to debug computing equipment. This is merely illustrative and does not serve to limit the scope of the present invention. If desired, application specific integrated circuits, microprocessors, and other application specific standard products may be coupled to debug computing equipment for testing.

Figure 1:
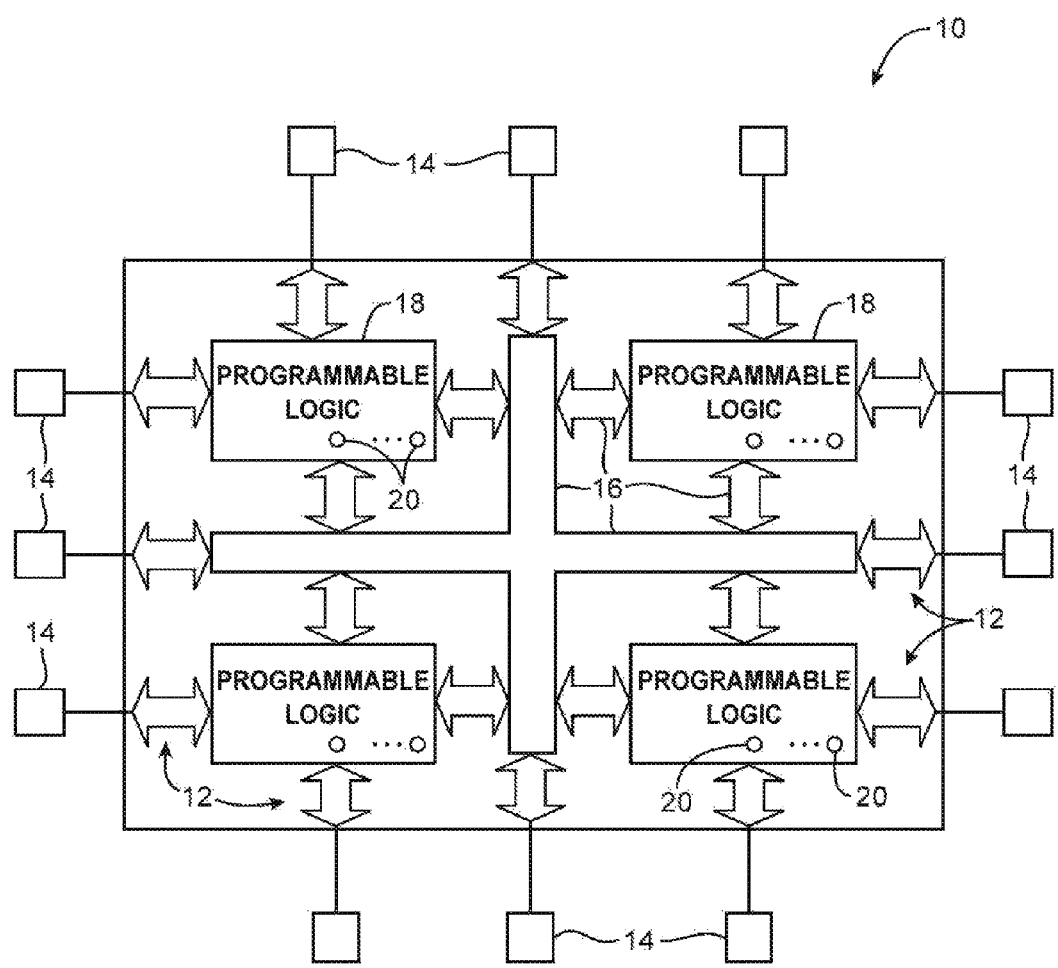
FIG. 1 is a diagram of an illustrative programmable integrated circuit that may be connected to debug equipment in accordance with an embodiment of the present invention.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. For example, programmable logic 18 may include look-up tables, registers, and multiplexers. The programmable logic 18 may be configured to perform a custom logic function. The programmable interconnects associated with interconnection resources may be considered to be a part of programmable logic 18.

Programmable logic 18 contains programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable element 20 may be used to provide a static control output signal for controlling the state of an associated logic component in programmable logic 18. The output signals generated by elements 20 are often applied to gates of metal-oxide-semiconductor (MOS) transistors (sometimes referred to as pass gate transistors). This example is merely illustrative. If desired, programmable elements 20 may be used to provide static output signals for configuring any desired circuitry on device 10.

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
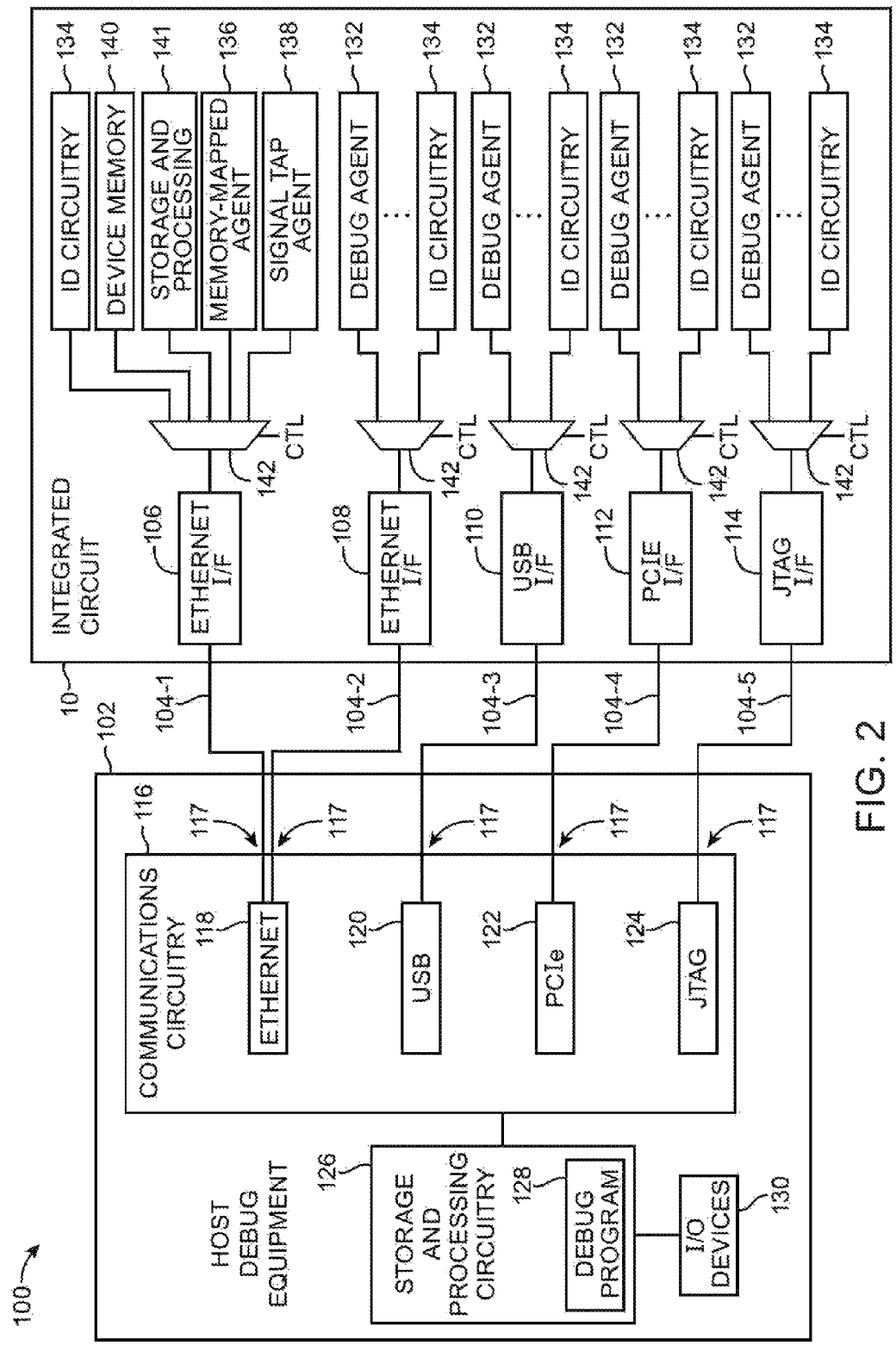
FIG. 2 is a diagram of an illustrative debug system in which an integrated circuit may be connected to debug equipment via multiple connections in accordance with an embodiment of the present invention.

Input-output circuitry 12 and input-output pins 14 may be used to interface with external circuitry or devices using desired interface standards and protocols. FIG. 2 is a diagram of an illustrative debug system 100 in which device 10 is coupled to host debug computing equipment 102 via paths 104. Integrated circuit 10 may be mounted on a printed circuit board (not shown). Paths 104 may include input-output pins 14 and input-output circuitry 12 (FIG. 1), and may include cables that are connected between host debug equipment 102 and device 10. For example, a printed circuit board on which integrated circuit 10 is mounted may include connectors to which connectors of the cables are plugged. Similarly, the cables may be plugged into connectors at host debug equipment 102.

Device 10 may include interface circuits that handle off-chip communications for various communications standards. In the example of FIG. 2, device 10 includes Ethernet interface circuits 106 and 108, Universal Serial Bus (USB) interface circuit 110, Peripheral Component Interconnect Express (PCIe) interface circuit 112, and Joint Test Action Group (JTAG) interface circuit 114. This example is merely illustrative. In general, device 10 may include any desired number of interface circuits for handling communications with external (off-chip) circuitry. For example, device 10 may include one, two, or more different interface circuits each handling communications for a different respective communications standard. If desired, device 10 may include one, two, or more different interface circuits each handling communications for a given standard. In the example of FIG. 2, Ethernet interface circuits 106 and 108 may each handle Ethernet communications over respective paths 104-1 and 104-2. Paths 104-1 and 104-2 may, for example, include Ethernet cables that are coupled between host debug equipment 102 and integrated circuit 10.

Host debug equipment 102 may be implemented using computing equipment such as portable or stationary computing equipment (e.g., a laptop, desktop, etc.) computer and may include communications circuitry 116 and storage and processing circuitry 126.

Communications circuitry 116 may communicate with integrated circuit 10 over paths 104 that are connected to interfaces 117 of communications circuitry 116. Communications circuitry 116 may include Ethernet communications circuitry 118, USB communications circuitry 120, PCIe communications circuitry 122, and JTAG communications circuitry 124 that may be coupled to interface circuits of device 10 via paths 104. The example of FIG. 2 in which host debug equipment 102 communicates with integrated circuit 10 using Ethernet, USB, PCIe, or JTAG is merely illustrative. Host debug equipment 102 may include communications circuitry 116 that handles communications using any desired standard or protocol.

Host debug equipment 102 may include storage and processing circuitry 126 that performs debug operations by communicating with device 10 using communications circuitry 116. Processing circuitry 126 may use communications circuitry 116 to send debug control commands to integrated circuit 10 over one or more selected paths 104. Similarly, data or other information received from device 10 may be conveyed to processing circuitry 126 using communications circuitry 116.

Host debug equipment 102 may include additional input/output devices 130. Input-output devices 130 may include input devices such as mice, keyboards, joysticks, touchpads, touchscreens, or other input devices and may include output devices such as one or more displays, speakers, etc. Input-output devices 130 may receive user input that is processed by storage and processing circuitry 126. For example, a display may be used to present an on-screen opportunity to a user for entering debug commands or to interact with debug operations performed by storage and processing circuitry 126. Input devices such as a keyboard or mouse may receive user input such as debug commands. The user input may include instructions to load or execute a debug program such as program 128 at storage circuitry 126.

Interface circuits of device 10 may be coupled to and serve as interfaces for on-chip circuitry as device memory 140, storage and processing circuitry 141, and debug circuitry. For example, on-chip device memory 140 such as random access memory or programmable memory elements can be accessed via the interface circuits. As another example, storage and processing circuitry 141 such as programmable logic or dedicated circuitry may be accessed via the interface circuits. Each interface circuit may be coupled to on-chip circuits via a multiplexer 142 that is controlled to convey signals between selected on-chip circuitry and the corresponding interface circuit. Each multiplexer 142 may include a control input that receives a control input signal CTL that controls the multiplexer to select from on-chip circuitry that is coupled to the multiplexer. The control input signals may be provided by the interface circuits or may be provided by other circuitry such as control circuitry on integrated circuit 10.

Debug circuitry that can be accessed via interface circuits and multiplexers 142 may include identification (ID) circuitry 134 and debug agent circuits such as debug agents 132, memory-mapped agent 136, and signal tap agent 138. The debug agent circuits may be controlled by host debug equipment 102 to perform debug operations such as testing or monitoring of on-chip device functionality. For example, memory-mapped or signal tap agents may be used to access internal data or signals to identify errors in device functions.

Figure 3:
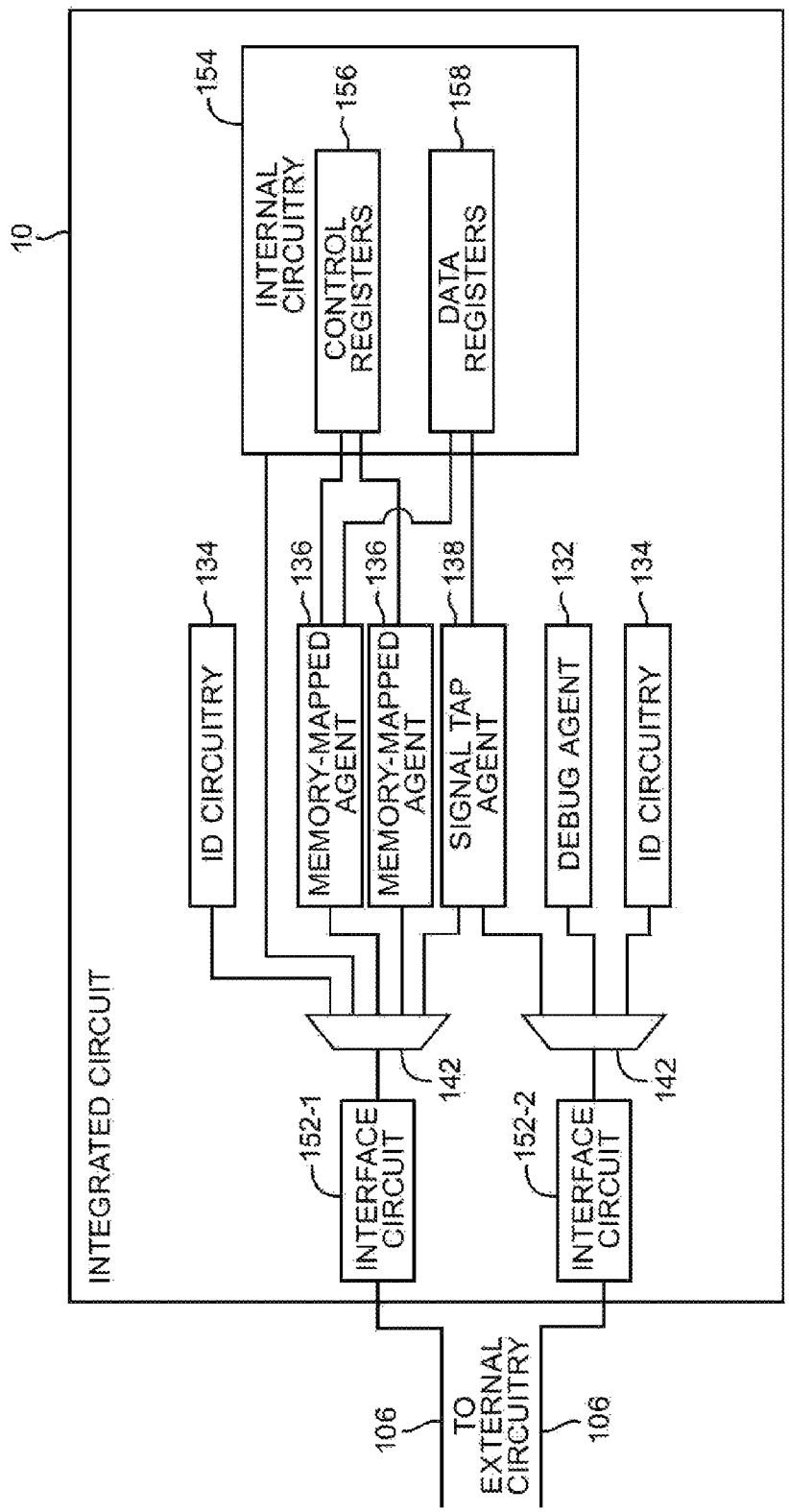
FIG. 3 is a diagram of an illustrative integrated circuit having interface circuits that may be used to access internal circuitry via debug agent circuits in accordance with an embodiment of the present invention.

FIG. 3 is a diagram of an illustrative integrated circuit 10 having debug agent circuits that can be controlled in performing debug operations on internal circuitry 154 of device 10. As shown in FIG. 3, integrated circuit 10 may include interface circuits 152 that interface between external (off-chip) circuitry and on-chip circuitry. Each interface circuit may be provided with access to one or more debug agents which, if desired, may be shared between interface circuits. In the example of FIG. 3, interface circuit 152-1 may be coupled to memory-mapped agents 136 and signal tap agent 138 via a first multiplexer 142, whereas interface circuit 152-2 may be coupled to debug agent 132 and signal tap agent 138 via a second multiplexer 142. Signal tap agent 138 may be shared between interface circuits 152-1 and 152-2. This example is merely illustrative. Interface circuit 152-1 may be coupled to any desired combination of debug agents such as one, two, three, or more memory-mapped agents, signal tap agents, etc.

Each memory-mapped agent 136 may serve as a memory-mapped interface between external circuitry and internal registers such as control registers 156 and data registers 158. Commands received from external circuitry may include read and write commands that direct memory-mapped agent 136 to retrieve or store data at a specified address. Memory-mapped agent 136 maps the specified address to a corresponding register. For example, external host debug equipment may send a write command to memory-mapped agent 136 via interface circuit 152-1. The write command may specify data and the address of a given control register. Memory-mapped agent 136 may receive the write command and write the data to the given control register. The data written to the control register may include control data that controls the operation of internal circuitry 154 (e.g., the control data may initialize a debug test that is performed based on settings provided in the control data). The host debug equipment may issue one or more read commands to retrieve data that is produced by internal circuitry 154 when performing the debug test. The retrieved data may be used in verifying the functionality of the internal circuitry.

Signal tap agent 138 may be used to monitor signals passing on data or control paths within internal circuitry 154. For example, signal tap agent 138 may be coupled to signal paths within internal circuitry such as programmable logic, interconnects, or dedicated circuitry. External host debug equipment may send commands to signal tap agent 138 to monitor one or more selected signal paths during debug operations.

Debug agent 132 may be a memory-mapped agent, a signal tap agent, or other agents such as a debug interface for a processor (e.g., a general purpose processor), a system memory interface, etc. In general, each debug agent circuit may receive commands from host debug equipment via interface circuits and may be used to monitor or control internal circuitry 154 during debug operations.

Each interface circuit may be coupled to a respective identification circuit 134 that can be used in identifying the interface circuit. Identification circuitry 134 may include logic circuitry and storage circuitry such as registers. The storage circuitry may be used to store an identifier for the corresponding interface circuit. The identifier may identify the type of the corresponding interface. For example, the identifier may identify whether the corresponding interface is a USB interface, a JTAG interface, an Ethernet interface, a PCIe interface, etc. The identifier may identify the device to which the corresponding interface belongs. For example, a programmable integrated circuit is typically loaded with configuration data that configures the programmable integrated circuit to perform a desired function. In this scenario, the identifier may be generated from a hash of the configuration data (e.g., different hash values are generated for different configuration data). The device hash value may be combined with the interface type information to generate the identifier that is stored in identification circuitry 134. The identifier may be retrieved by external circuitry such as host debug equipment when initializing connections between the host and devices to help determine which connections are associated with each device.

Figure 4:
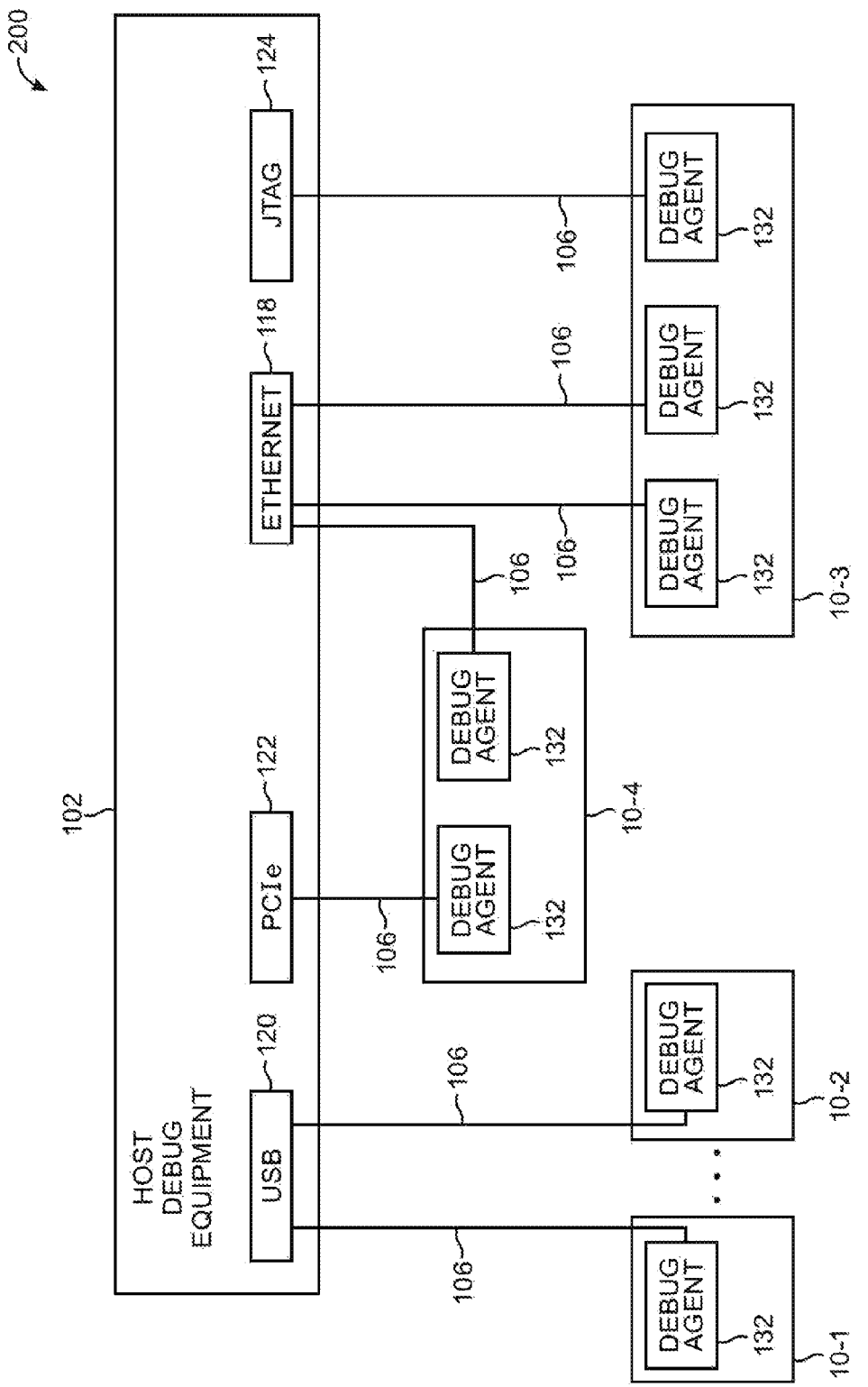
FIG. 4 is a diagram of an illustrative debug system in which multiple integrated circuits may be connected to debug equipment in accordance with an embodiment of the present invention.

Host debug computing equipment may be used to perform debug operations on multiple different devices. FIG. 4 is a diagram of an illustrative debug system 200 in which host debug computing equipment 102 is coupled to devices 10-1, 10-2, 10-3, and 10-4. Each device may be coupled to host debug equipment 102 via a corresponding path 106. As shown in FIG. 4, each device may communicate with host debug equipment using one or more communications standards. Device 10-1 and 10-2 may each include a USB interface circuit that communicates with USB communications circuitry 120. Device 10-4 may include a PCIe interface circuit that communicates with PCIe communications circuitry 122 and may include an Ethernet interface circuit that is coupled to Ethernet communications circuitry 118. Device 10-3 may include a JTAG interface circuit that communicates with JTAG communications circuitry 124 and may include multiple Ethernet interface circuits that are coupled to Ethernet communications circuitry 118 via respective paths 106 (e.g., different Ethernet cables may be plugged into device 10-3).

The communications standards used to connect a given device to host debug equipment may be limited by the capabilities of the given device and the host debug equipment. For example, device 10-1 may have only USB interface circuits that can be connected to host debug equipment 102 via a USB cable. This example is merely illustrative. Device 10-1 may include additional interface circuits for other standards that are merely unused (e.g., no cable has been connected between the additional interface circuits and host debug equipment 102).

During connection operations such as during initial startup of debug system 200 or when a user connects or disconnects paths 106, it can be challenging for host debug equipment 102 to correctly identify which connections are associated with each debug agent 132. For example, devices 10-4 and 10-3 may be programmable logic devices that have each been loaded with identical configuration data. In this scenario, the hash values generated from the configuration data and stored in identification circuits may be the same for devices 10-3 and 10-4. It can therefore be difficult for host debug equipment 102 to differentiate between connections to device 10-3 and device 10-4, especially when both devices are coupled to host debug equipment 102 via connections of the same type (e.g., device 10-3 and 10-4 may be coupled to host debug equipment 102 via Ethernet connections). In addition, paths 106 can be dynamically connected or disconnected. For example, users can connect and disconnect cables at any given time. In response to a change of system state such as updated device connections, host debug equipment 102 may be required to resolve potential connection conflicts.

Figure 5:
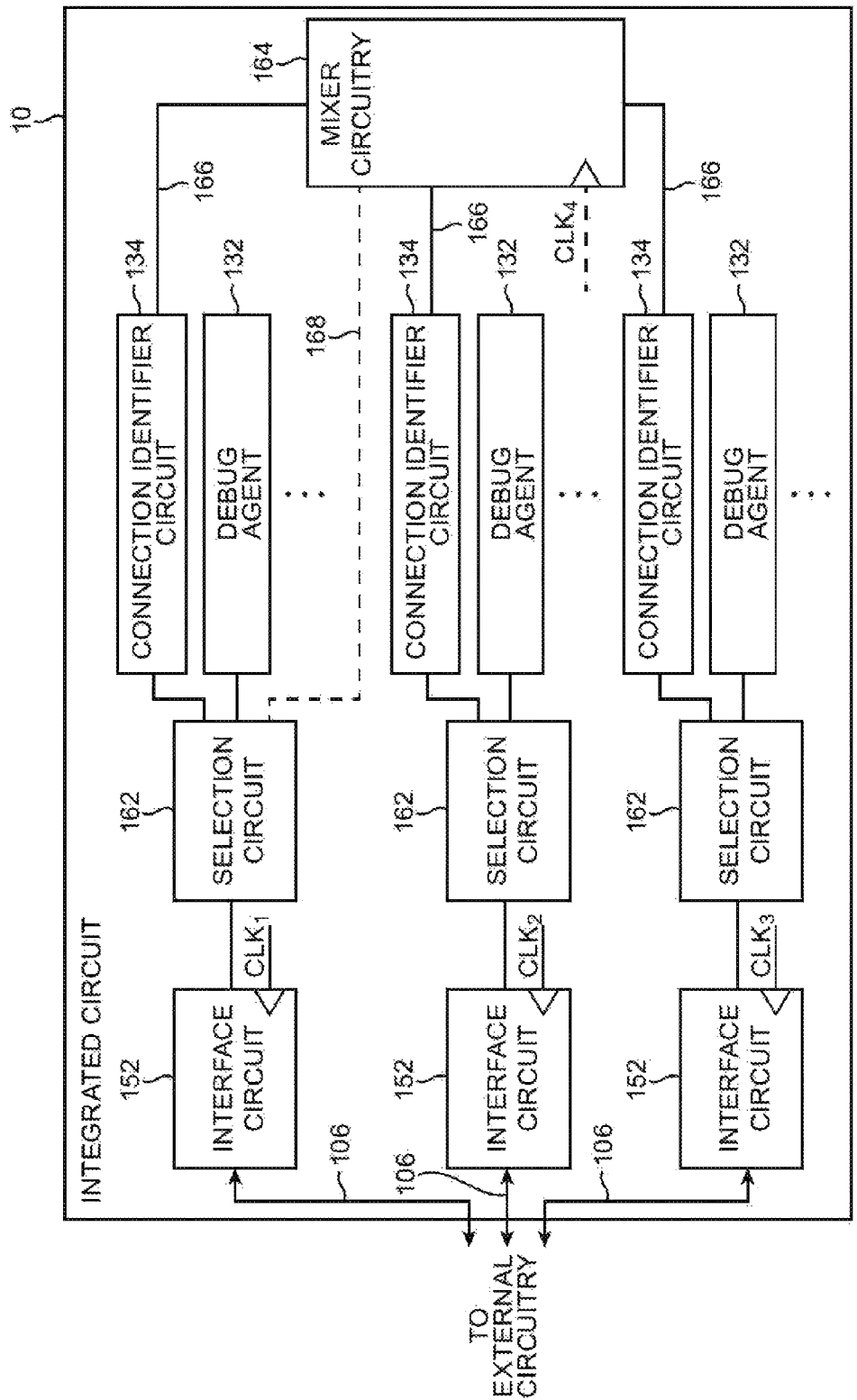
FIG. 5 is a diagram of an illustrative integrated circuit having interface circuits that are coupled to connection identifier circuits having shared mixer circuitry for identifying the interface circuits and the integrated circuit during debug connection operations in accordance with an embodiment of the present invention.

Integrated circuits may be provided with connection identifier circuits having shared mixer circuitry. The shared mixer circuitry may be used by host debug equipment during connection setup operations to differentiate between connections to different devices (e.g., even when the devices are loaded with identical configuration data). FIG. 5 is a diagram of an illustrative integrated circuit 10 having connection identifier circuits 134 that are coupled to shared mixer circuitry 164 via paths 166.

As shown in FIG. 5, each connection identifier circuit 134 may be coupled to a respective interface circuit 152 via a selection circuit 162. Selection circuits 162 may be multiplexers such as multiplexer 142 of FIG. 3 or may be any desired selection circuits that selectively couple interface circuits 152 to internal circuitry. Each selection circuit 162 may be coupled to one or more debug agents 132.

Mixer circuitry 164 may receive input signals from connection identifier circuits 134 via paths 166 and combine the inputs to form a mixer output signal. The mixer output signal may be used to help differentiate between devices, as adjustments to the mixer input signals provided by the connection identifier circuits are only reflected at one of the devices. In other words, external host debug equipment can differentiate between devices by manipulating one or more mixer input signals and observing the mixer output signals across all connected devices.

If desired, mixer circuitry 164 may communicate directly with external circuitry using optional paths such as path 168 that are coupled between selection circuits 162 and mixer circuitry 164 (e.g., bypassing connection identifier circuits 134). For example, mixer input signals may be provided directly by external host debug equipment over paths such as path 168 instead of being routed through connection identifier circuits 134.

Each interface circuit 152 that is coupled to mixer circuitry 164 may potentially belong to different clock domains that operate using different clock signals CLK1, CLK2, and CLK3. As examples, Ethernet interface circuits may operate using clock signals at 2.5 MHz, 20 MHz, 25 MHz, 50 MHz, and 125 MHz, JTAG interface circuits may operate using clock signals at 10-100 MHz, USB interface circuits may operate at a clock frequency of 6 MHz, 12 MHz, or 24 MHz, and PCIe interface circuits may operate at a clock speed of 100 MHz. These examples are merely illustrative. Each interface circuit may belong to any desired clock domain and operate at any clock frequency based on the type or desired function of the interface circuits.

If desired, mixer circuitry 164 may operate using optional clock signal CLK4. Clock signal CLK4 may be the same as clock signal CLK1, CLK2, or CLK3 or may have a different frequency or phase. If desired, mixer circuitry 164 may be provided that is not controlled by a clock signal such as clock signal CLK4. Mixer circuitry 164 that is not controlled by a clock signal may be capable of handling scenarios such as when clock signals are unavailable (e.g., due to disconnection of external circuitry such as disconnection of one or more paths 106 of FIG. 3).

Figure 6:
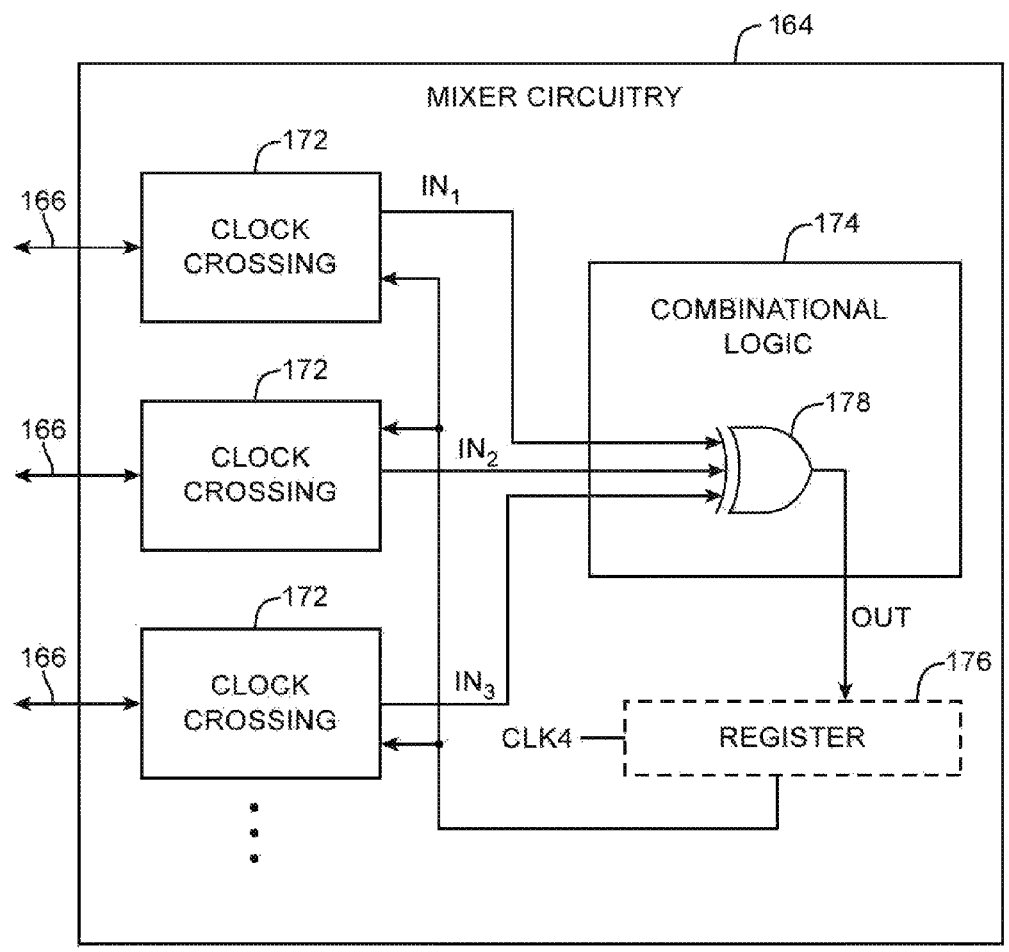
FIG. 6 is a diagram of illustrative mixer circuitry having clock crossing circuitry and combinational logic in accordance with an embodiment of the present invention.

Mismatch in frequency or phase of clock signals for different interface circuits 152 can cause communications errors at mixer circuitry 164 that combines signals from multiple interface circuits. Mixer circuitry 164 may be provided with clock crossing circuitry that accommodates mismatch between clock signals of different interface circuits. FIG. 6 is a diagram of illustrative mixer circuitry 164 that may be shared between selection circuits such as selection circuits 162 of FIG. 5 (and between interface circuits such as interface circuits 152). As shown in FIG. 6, mixer circuitry 164 may include clock crossing circuits 172, and combinational logic 174.

Clock crossing circuits 172 may be used to interface between clock domains. Each clock crossing circuit 172 may handle data transfer between the clock domain of a corresponding interface circuit and the clock domain of mixer circuitry 164 (sometimes referred to as clock crossing). Clock crossing circuit 172 may, for example, include asynchronous clock crossing circuitry such as an asynchronous first-in-first-out (FIFO) buffer that operates using the clock signals of mixer circuitry 164 (e.g., CLK4) and the corresponding interface circuit (e.g., CLK1, CLK2, or CLK3). This example is merely illustrative. If desired, clock crossing circuit 172 may include synchronous or pseudo-synchronous circuitry such as a series of flip-flops in which a first portion of the flip-flops are clocked using the clock signal of the interface circuit and a second portion of the flip-flops are clocked using the clock signal of the mixer circuitry.

Mixer input signals IN1, IN2, and IN3 received via paths 166 may be processed by clock crossing circuits 172 and provided to combinational logic 174. Combinational logic 174 may perform a logic function on the input signals to produce output signal OUT. Mixer output signal OUT may be provided via paths 166 to other circuitry such as connection identifier circuit 134 or interface circuit 152. If desired, optional storage circuitry such as register 176 may be used to store mixer output signal OUT. Optional register 176 may receive optional clock signal CLK4 and store mixer output signal OUT based on clock signal CLK4. For example, register 176 may be triggered to store output signal OUT by edges or levels of clock signal CLK4.

If desired, clock crossing circuits 172 may be provided in only one direction between mixer circuitry 164 and interface circuits. For example, clock crossing circuits 172 may receive and pass input signals from interface circuits to combinational logic 174, whereas output signal OUT may be provided to paths 166 without traversing clock crossing circuits 172 (e.g., output signal OUT may be passed to paths 166 directly from combinational logic 174). As another example, output signal OUT may traverse clock crossing circuits 172, whereas input signals IN1, IN2, and/or IN3 may be provided directly to combinational logic 174 from paths 166.

In the example of FIG. 6, combinational logic 174 includes an XOR gate 178 that performs an XOR function on input signals IN1, IN2, and IN3 to produce output signal OUT. However, this example is merely illustrative. Combinational logic 174 may include any desired logic gate such as AND gates, OR gates, NAND gates, NOR gates, etc. In general, any suitable arrangement of logic gates may be used to perform a desired logic function on the mixer input signals to produce output signal OUT (e.g., a single logic gate, multiple logic gates coupled in successive stages, etc.).

The example of FIG. 6 in which three input signals are received and processed by mixer circuitry 164 is merely illustrative. Mixer circuitry 164 may receive any desired number of input signals (e.g., from connection identifier circuits or interface circuits).

Figure 7:
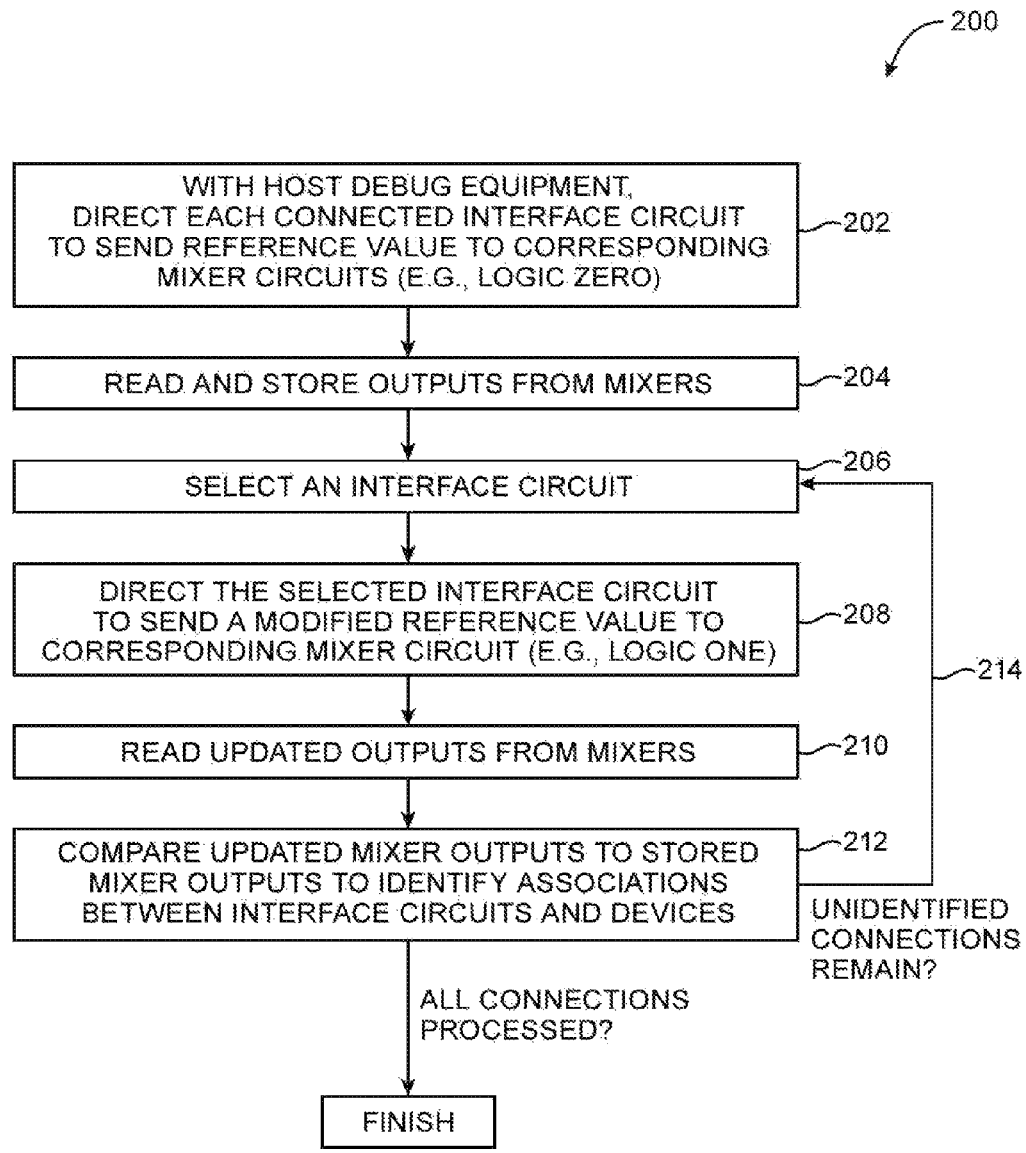
FIG. 7 is a flow chart of illustrative steps that may be performed using host debug equipment to identify associations between interfaces and connected devices using mixer circuitry at the connected devices in accordance with an embodiment of the present invention.

FIG. 7 is a flow chart 200 of illustrative steps that may be performed using host debug equipment such as host debug equipment 102 of FIG. 2 during initial connection operations. For example, the host debug equipment may perform the steps of flow chart 200 in response to detecting that one or more new connections to an electronic device have been made (e.g., in response to establishment of paths 106).

During step 202, the host debug equipment may direct each connected interface circuit to send a reference value to a corresponding mixer circuit. For example, the reference value may be zero (e.g., all bits are logic zero) or other predetermined reference value. In scenarios in which the host debug equipment is not connected to a given interface circuit (e.g., no cable is plugged in for that interface circuit), the mixer circuit may use a predetermined default reference value such as logic zero to help ensure that the mixer output value is determined by the reference values provided by the host debug equipment.

During step 204, the host debug equipment may read and store the output signals from the registers of the mixer circuitry. The host debug equipment may retrieve the output signals by communicating with connection identifier circuits 134 (e.g., sending a request for the register data from the connection identifier circuits). The host debug equipment may retrieve mixer output signals for each interface circuit that is coupled to the host debug equipment (e.g., for each connection between the host debug equipment and the devices). For example, in the scenario of FIG. 4, host debug equipment 102 may retrieve a first mixer output signal from device 10-1 (e.g., by communicating with a USB interface circuit at device 10-1), a second mixer output signal from a USB interface circuit at device 10-2, a third mixer output signal from a PCIe interface circuit at device 10-4, a fourth mixer output signal from an Ethernet interface circuit at device 10-4, a fifth mixer output signal from a first Ethernet interface circuit at device 10-3, a sixth mixer output signal from a second Ethernet interface circuit at device 10-3, and a seventh mixer output signal from a JTAG interface circuit at device 10-3.

During step 206, the host debug equipment may select an interface circuit (e.g., by selecting an interface of the host debug equipment such as interfaces 117 of FIG. 2 that is connected to the interface circuit) for processing. During subsequent step 208, the host debug equipment may use the appropriate interface to direct the selected interface circuit to send a modified reference value to a corresponding mixer circuit. The modified reference value may be selected based on the combinational logic implemented in the mixer circuitry of the devices. In the scenario of FIG. 6 in which the mixer circuitry uses a logic XOR gate to process mixer input signals, the host debug equipment may provide an inverted reference value at the appropriate interface to the selected interface circuit. In this scenario, the inversion of a mixer input signal causes the logic XOR gate to produce an inverted mixer output signal.

During step 210, the host debug equipment may retrieve updated output signals from the mixer circuitry of each connected interface circuit. During subsequent step 212, the host debug equipment may compare the updated output signals to the stored mixer outputs to identify which interface circuits belong to the same device as the selected interface circuit. The interface circuits associated with the same device as the selected interface circuit may be identified because the mixer output signals for those interface circuits are different from the stored mixer output signals. Interface circuits that do not belong to the same device as the selected interface circuit do not share mixer circuitry with the selected interface circuit and are therefore unaffected by the modified reference value provided to the selected interface circuit.

If unidentified interface circuits remain at the completion of step 212, the process may return to step 206 via path 214. For example, if interface circuits remain that have yet been grouped as belonging to a device, the process may return to step 206 to select from the remaining, unidentified interface circuits. If all interface circuits have been processed (all connections have been processed), the operations of flow chart 200 may be complete.

Figure 8:
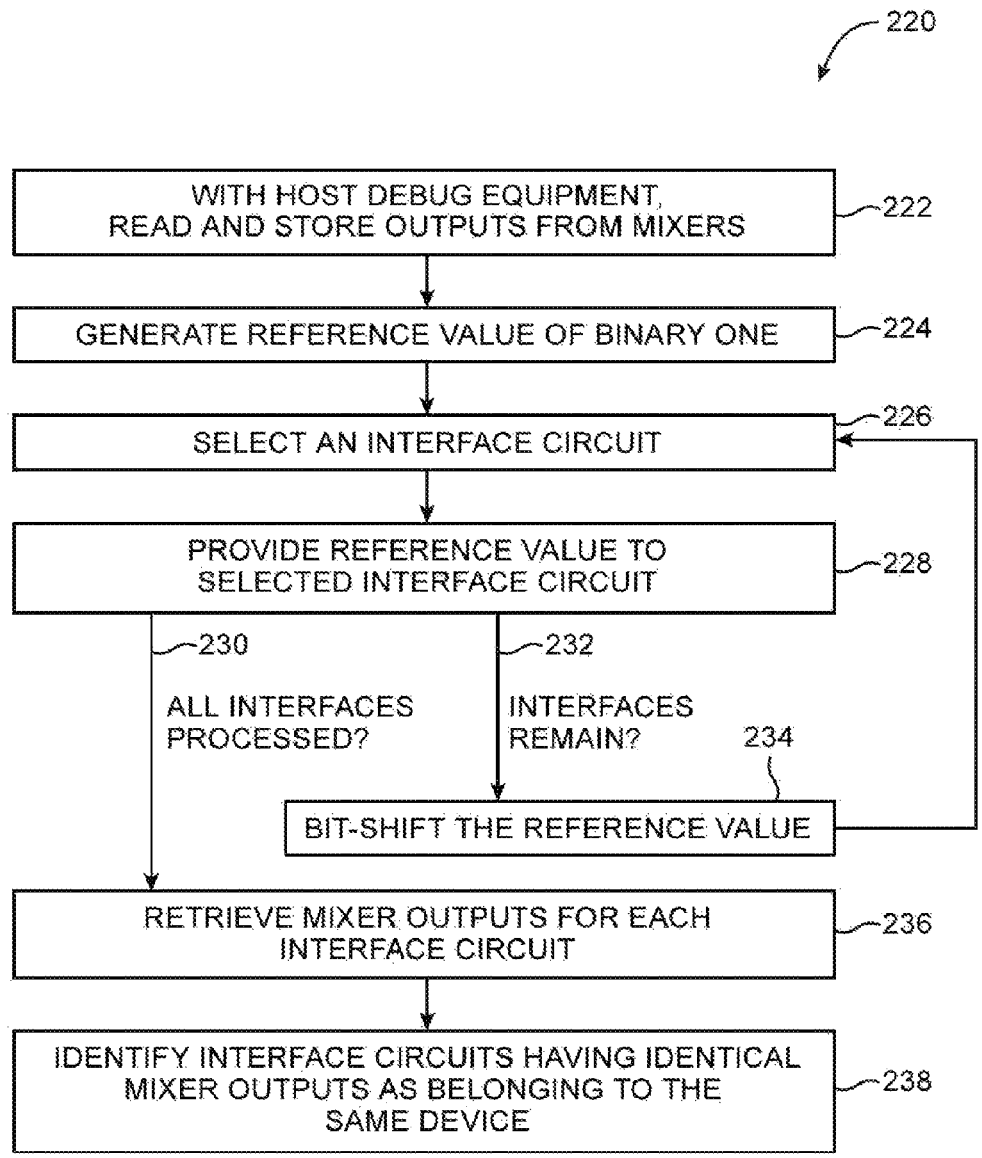
FIG. 8 is a flow chart of illustrative steps that may be performed using host debug equipment to identify associations between interfaces and connected devices using mixer circuitry of the connected devices having XOR combinational logic in accordance with an embodiment of the present invention.

If desired, the steps performed by host debug equipment to identify associations between interfaces of the host debug equipment and devices may be optimized based on the arrangement of combinational logic circuitry within the mixer circuitry of the devices. FIG. 8 is a flow chart 220 of illustrative steps that may be performed by host debug equipment to identify groups of device interfaces from mixer circuitry including XOR combinational logic. The steps of flow chart 220 may, for example, be performed for connected devices having mixer circuitry 164 of FIG. 6 in which combinational logic 174 includes logic XOR gate 178 that combines signals from interface circuits.

During step 222, the host debug equipment may read and store output signals from the mixers. During subsequent step 224, the host debug equipment may generate a reference value of binary one. The number of bits in the reference value may correspond to the number of interface circuits that are or may be connected to the host debug equipment. For example, in the scenario of FIG. 4 in which seven interface circuits are connected between host debug equipment 102 and devices 10, the binary reference value may be "0000001." During step 226, the host debug equipment may select an interface circuit for processing. During subsequent step 228, the host debug equipment may provide the reference value to the selected interface circuit (e.g., similar to step 208 of flow chart 200 of FIG. 7). If connected interface circuits remain to be processed (e.g., by providing reference values to the interface circuits), the operations of step 234 may be performed. If all connected interface circuits have been processed, the operations of step 236 may be performed.

During step 234, the host debug equipment may bit-shift the current reference value. For example, a binary reference value of "0000001" may be bit-shifted to "0000010," whereas a binary reference value of "0000010" may be bit-shifted to "0000100." Such encoding of reference values may sometimes be referred to as one-hot encoding. The process may then return to step 226 to process the remaining interface circuits.

During step 236, the host debug equipment may retrieve the mixer outputs for each interface circuit (e.g., one mixer output value is associated with each interface circuit). Due to the one-hot encoding of reference values provided to each interface circuit, the logic XOR gate of each device produces a different mixer output value that is shared among the interface circuits of that device. During subsequent step 238, the host debug equipment may identify interface circuits having identical mixer outputs as belonging to the same device.

Consider the scenario of FIG. 4 and in which each device includes mixer circuitry with an XOR logic gate that produces a mixer output value. In this scenario, a sequence of bit-shifted reference values "0000001," "0000010," "0000100," "0001000," "0010000, "0100000," and "1000000" may provided via the USB interface of the host debug equipment that is connected to device 10-1, the USB interface connected to device 10-2, the PCIe interface connected to device 10-4, the Ethernet interface connected to device 10-4, a first Ethernet interface connected to device 10-3, a second Ethernet interface connected to device 10-3, and the JTAG interface connected to device 10-3, respectively. In this scenario, the mixer output value of device 10-1 may be "0000001," the mixer output value of device 10-2 may be "0000010," the mixer output value for each interface circuit of device 10-4 may be "0001100," and the mixer output value of each interface circuit of device 10-3 may be "1110000." The interface circuits of different devices may therefore be distinguished by the mixer output values.

The above example in which seven interface circuit connections are made is merely illustrative. In scenarios such as when only a subset of the available interface circuits are connected to the host debug equipment, expected mixer output values may be determined from previously retrieved mixer output signals (e.g., during step 222) and the generated reference values (e.g., from step 224).

Mixer output signals retrieved and stored during step 222 may be used to help determine whether reference values are correctly provided to mixer circuitry of the connected devices. For example, the mixer output values retrieved during step 236 may be compared to expected possibilities given the reference values provided during step 228. Reference values such as "0000000" that are not possible given a one-hot input encoding and the XOR gate of the mixer circuitry may be identified and the mixer output signals stored during step 222 may be used to help determine which reference values were incorrectly provided to mixer circuitry (e.g., thereby also identifying faulty connections or interface circuits).

Figure 9:
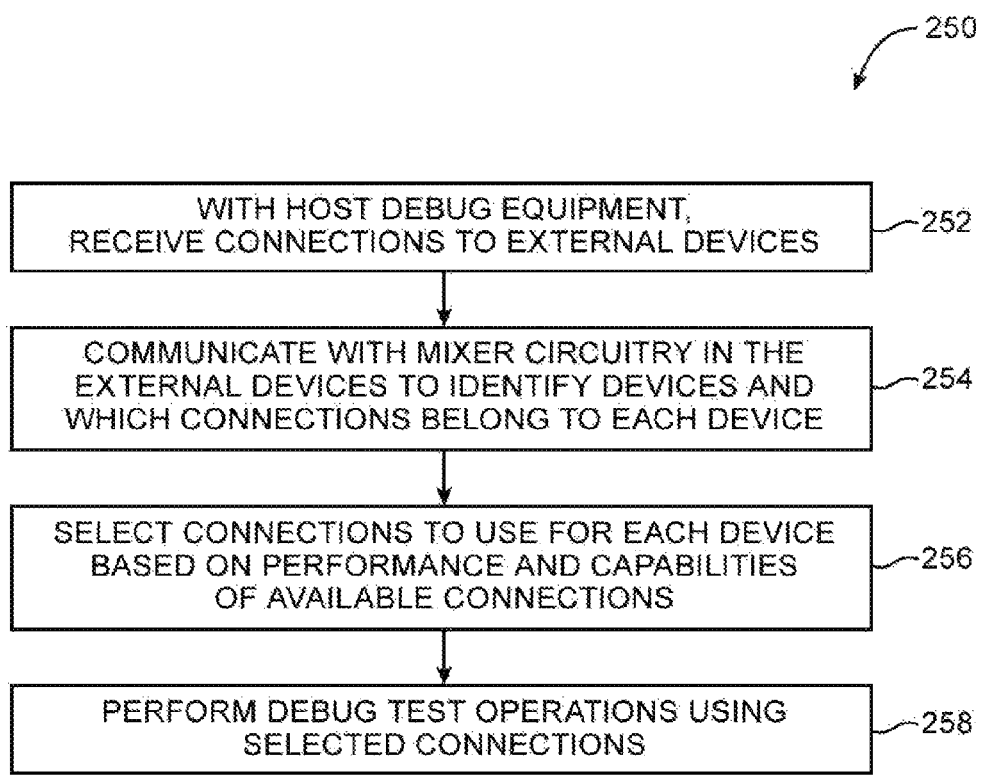
FIG. 9 is a flow chart of illustrative steps that may be performed using host debug equipment to identify associations between interfaces and connected devices and select connections for use during debug test operations in accordance with an embodiment of the present invention.

By identifying associations between connections and devices, host debug equipment may be able to select optimal connections for use during debug test operations. Debug test operations include any desired test operations such as measurements performed on internal circuitry of the test device. FIG. 9 is a flow chart 250 of illustrative steps that may be performed by host debug equipment to select connections for use in performing debug test operations.

During step 252, the host debug equipment may receive connections to devices such as programmable integrated circuits having mixer circuitry. For example, the host debug equipment may receive and detect cables that are plugged in to corresponding ports at the host debug equipment and at the devices (e.g., ports at the devices for respective device interfaces).

During step 254, the host debug equipment may communicate with the devices to determine which groups of connections are associated with different devices. The host debug equipment may access mixer circuitry at the devices to identify groups of connections. For example, the steps of flow chart 200 of FIG. 7 or flow chart 220 of FIG. 8 may be performed to identify associations between connections (e.g., connections to device interfaces) and devices.

During step 256, the host debug equipment may select connections to use for each device based on performance and capabilities of available connections to that device. The capabilities of each connection may be predefined by the corresponding communications standard, by the capabilities of communications circuitry at host debug equipment 102, or determined from information retrieved from the connected devices (e.g., host debug equipment 102 may send a request or otherwise retrieve interface communications capabilities from the interface circuits of each device). As examples, PCIe communications speeds may be 250 MBps (megabytes per second) for each PCIe lane of a connection, Ethernet communications speeds may be 10 Mbps to 100 Gbps (gigabits per second), USB communications speeds may be 1.5-5000 Mbps (megabits per second), and JTAG communications speeds may be 1 Mbps. Connections such as JTAG connections may be functional during initial start-up operations of an external device and may be selected to perform debug testing during start-up (e.g., in contrast to interfaces such as Ethernet that function after initial start-up).

Consider the scenario of FIG. 2 in which a Ethernet, USB, PCIe, and JTAG connections are identified be host debug equipment 102 and device 10. In this scenario, host debug equipment 102 may identify the performance and functional capabilities of each connection to determine which connection should be used for executing debug program 128. If the debug program includes tests that are to be performed during initial start-up of device 10, an appropriate connection such as JTAG connection 104-5 may be selected. If multiple connections have functional capabilities that satisfy the requirements of debug program 128, the connection may be selected based on performance metrics such as communications speeds (e.g., data transfer rates).

During step 258, the host debug equipment may perform debug test operations using the selected connections for each device (e.g., by executing one or more debug programs stored at the host debug equipment).

It can be a significant undertaking to design and implement a desired logic circuit in a programmable logic device. Logic designers therefore generally use logic design systems based on computer-aided-design (CAD) tools to assist them in designing circuits. A logic design system (sometimes referred to as a circuit design system) can help a logic designer design and test complex circuits for a system. When a design is complete, the logic design system may be used to generate configuration data for electrically programming the appropriate programmable logic device. The logic design system may be implemented on computing equipment.

Figure 10:
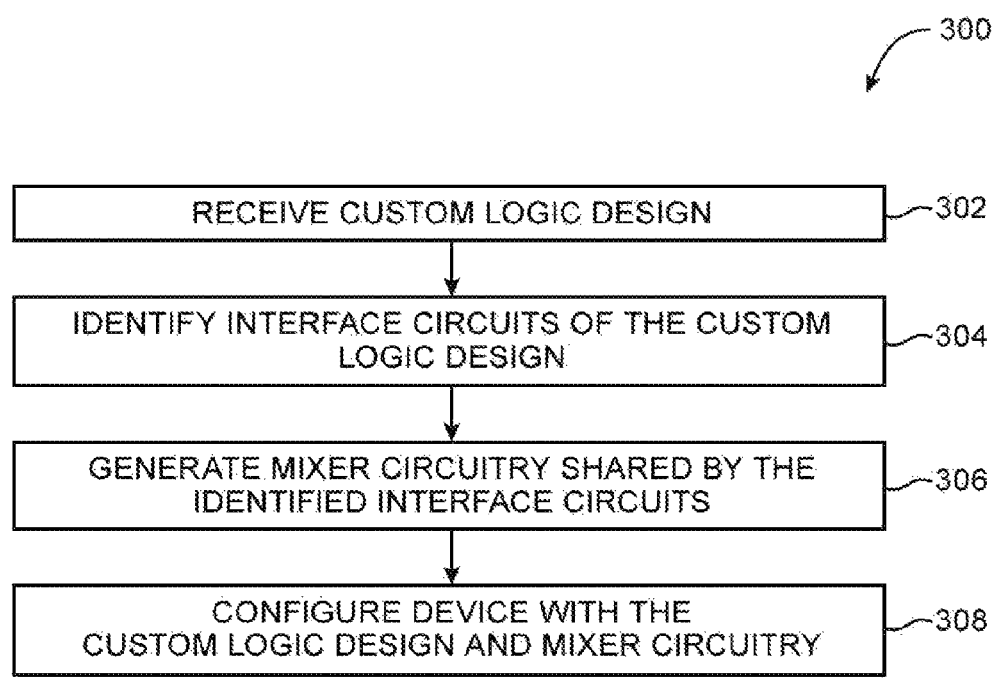
FIG. 10 is a diagram of illustrative steps that may be performed using logic design computing equipment to automatically provide mixer circuitry for a custom logic design in accordance with an embodiment of the present invention.

FIG. 10 is a diagram of illustrative steps that may be performed using logic design computing equipment to automatically provide mixer circuitry for a custom logic design. During step 302, the logic design computing equipment may receive a custom logic design (e.g., from a user). During step 304, the logic design computing equipment may identify interface circuits of the custom logic design. In other words, the logic design computing equipment may determine whether interface circuits exist in the custom logic design and may proceed to step 306 in response to identifying interface circuits in the custom logic design. As an example, interface circuits that serve as interfaces with external circuitry may be identified. During subsequent step 306, the logic design computing equipment may generate mixer circuitry such as mixer circuitry 164 of FIG. 5 that is shared by the identified interface circuits. For example, configuration data for the mixer circuitry may be generated and added to configuration data for the custom logic design. An identification circuit may be generated for each interface circuit (e.g., such that each interface circuit is coupled to the mixer circuitry via a respective identification circuit). During step 308, the logic design computing equipment may configure the programmable logic device with the custom logic design and the mixer circuitry (e.g., by loading the configuration data onto the device).

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
    a plurality of interface circuits that interface with external circuitry;
    a plurality of identification circuits each coupled to and identifying a respective interface circuit; and
    mixer circuitry shared between the plurality of identification circuits, wherein the mixer circuitry receives mixer input signals from the identification circuits and generates a mixer output signal from the received input signals.

2. The integrated circuit defined in claim 1 wherein the integrated circuit comprises a programmable integrated circuit having programmable elements in which configuration data is loaded and wherein each identification circuit of the plurality of identification circuits stores an identifier generated at least partly based on the configuration data.

3. The integrated circuit defined in claim 2 wherein each interface circuit is coupled to at least one debug agent circuit through which internal circuitry is accessed during debug operations performed using that interface circuit.

4. The integrated circuit defined in claim 3 wherein the mixer circuitry comprises combinational logic circuitry that performs a logic function on the mixer input signals received from the identification circuits to produce the mixer output signal.

5. The integrated circuit defined in claim 4 wherein the mixer circuitry is not controlled by any clock signal.

6. The integrated circuit defined in claim 4 further comprising storage circuitry that receives and stores the mixer output signal.

7. The integrated circuit defined in claim 6 wherein the mixer circuitry further comprises a clock crossing circuit that interfaces between a first clock domain of the interface circuits and a second clock domain of the mixer circuitry.

8. The integrated circuit defined in claim 4 wherein the combinational logic circuitry comprises a logic XOR gate.

9. The integrated circuit defined in claim 3 wherein at least one interface circuit is coupled to a signal tap agent circuit.

10. The integrated circuit defined in claim 3 wherein at least one interface circuit is coupled to a memory-mapped agent circuit.

11. The integrated circuit defined in claim 1 wherein the plurality of interface circuits include at least one interface circuit selected from the group consisting of: a USB interface circuit, a PCIe interface circuit, an Ethernet interface circuit, and a JTAG interface circuit.

12. A method of operating debug computing equipment having a plurality of interfaces, the method comprising:
    with the plurality of interfaces, receiving connections to interface circuits of external devices, wherein each of the external devices includes mixer circuitry that is shared between the interface circuits of that external device; and
    with the plurality of interfaces, communicating with the mixer circuitry through each of the connected interface circuits to identify groups of interfaces that are connected to different external devices.

13. The method defined in claim 12 further comprising:
    selecting an interface from the group of interfaces for a given one of the external devices; and
    performing debug test operations over the selected interface.

14. The method defined in claim 13 wherein selecting the interface from the group of interfaces for the given external device comprises:
    selecting the interface from the group of interfaces for the given one of the external devices based on performance capabilities of the group of interfaces for the given external device.

15. The method defined in claim 14 wherein selecting the interface from the group of interfaces for the given one of the external devices comprises:
    selecting the interface from the group of interfaces for the given one of the external devices based on functional capabilities of the group of interfaces for the given one of the external devices.

16. The method defined in claim 12 wherein communicating with the mixer circuitry through each of the connected interface circuits to identify the groups of interfaces that are connected to different external devices comprises:
    directing each connected interface circuit to provide a reference value to the mixer circuitry of that connected interface circuit; and
    retrieving mixer output signals for each connected interface circuit.

17. The method defined in claim 16 wherein communicating with the mixer circuitry through each of the connected interface circuits to identify the groups of interfaces that are connected to different external devices further comprises:
    selecting an interface circuit;
    directing the selected interface circuit to provide a modified reference value to the mixer circuitry of the selected interface circuit; and
    retrieving updated mixer output signals for each connected interface circuit.

18. The method defined in claim 17 wherein communicating with the mixer circuitry through each of the connected interface circuits to identify the groups of interfaces that are connected to different external devices further comprises:
    comparing the updated mixer output signals to the mixer output signals to identify the groups of interfaces that are connected to different external devices.

19. The method defined in claim 16 wherein the reference values provided to the interface circuits comprise a sequence of bit-shifted reference values.

20. Host debug computing equipment comprising:
    a plurality of interfaces that receive connections to external devices; and
    storage and processing circuitry that communicates with the external devices over the plurality of interfaces to determine which interfaces are associated with each external device.

21. The host debug computing equipment defined in claim 20 wherein the storage and processing circuitry generates a plurality of reference values each provided from a respective interface to the external device connected to the respective interface, wherein the storage and processing circuitry retrieves output values from the external devices that have been generated based on the plurality of reference values, and wherein the storage and processing circuitry determines which interfaces are associated with each external device based on the retrieved output values.

22. The host debug computing equipment defined in claim 21 wherein the plurality of reference values comprises a sequence of bit-shifted reference values.

23. A method of configuring a programmable integrated circuit using a logic design computing equipment, the method comprising:
- receiving a custom logic design for the programmable integrated circuit;
- identifying interface circuits of the custom logic design; and
- generating mixer circuitry that is coupled to each of the identified interface circuits, wherein generating the mixer circuitry comprises:
  - generating an XOR circuit having inputs that are respectively coupled to each of the identified interface circuits and having an output that is coupled to each of the identified interface circuits.

24. The method defined in claim 23 further comprising:
configuring the programmable integrated circuit with the custom logic design and the generated mixer circuitry.

25. The method defined in claim 23 further comprising:
for each identified interface circuit, generating an identification circuit that identifies that interface circuit, wherein each of the identification circuits is coupled to the mixer circuitry.

\* \* \* \* \*